United States Patent
Tsukano

(10) Patent No.: US 12,292,657 B2
(45) Date of Patent: May 6, 2025

(54) ELECTRONIC COMPONENT, MANUFACTURING METHOD THEREOF, AND ELECTRONIC APPARATUS

(71) Applicant: CANON KABUSHIKI KAISHA, Tokyo (JP)

(72) Inventor: Jun Tsukano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/666,091

(22) Filed: May 16, 2024

(65) Prior Publication Data

US 2024/0306306 A1    Sep. 12, 2024

Related U.S. Application Data

(62) Division of application No. 18/152,237, filed on Jan. 10, 2023, now abandoned.

(30) Foreign Application Priority Data

Jan. 28, 2022   (JP) ................. 2022-012027

(51) Int. Cl.
| | | |
|---|---|---|
| G02F 1/1345 | (2006.01) | |
| H05K 3/10 | (2006.01) | |
| H05K 3/36 | (2006.01) | |

(52) U.S. Cl.
CPC ........ *G02F 1/1345* (2013.01); *G02F 1/13452* (2013.01); *G02F 1/13456* (2021.01);
(Continued)

(58) Field of Classification Search
None
See application file for complete search history.

(56) References Cited

U.S. PATENT DOCUMENTS 11,160,176 B2   10/2021   Kang et al.
11,887,748 B2    1/2024   Morijiri et al.
(Continued)

FOREIGN PATENT DOCUMENTS

JP       2006-253665 A    9/2006
KR   10-2012-0052486 A    5/2012
(Continued)

OTHER PUBLICATIONS

Office Action in Taiwanese Application No. 112100028 (Mar. 2025).

*Primary Examiner* — Dung T Nguyen
(74) *Attorney, Agent, or Firm* — Venable LLP

(57) ABSTRACT

A manufacturing method of an electronic component includes preparing a first structure in which a first electrode is arranged on a first main surface of a first substrate, preparing a second structure in which a second electrode is arranged on a first main surface of a second substrate, and curing a bonding member while making the first main surface of the first substrate and the first main surface of the second substrate face each other via the bonding member and applying a force to the first structure and the second structure so as to pressurize the bonding member. At least one of the first electrode and the second electrode includes a window portion. In the curing, the bonding member is cured by irradiating the bonding member with light through the window portion.

4 Claims, 14 Drawing Sheets

(52) U.S. Cl.
CPC ............. *H05K 3/103* (2013.01); *H05K 3/361* (2013.01); *H05K 2203/0278* (2013.01)

(56) References Cited

U.S. PATENT DOCUMENTS

| | | |
|---|---|---|
| 2006/0191631 A1 | 8/2006 | Kojima et al. |
| 2007/0268441 A1 | 11/2007 | Liu et al. |
| 2019/0041685 A1* | 2/2019 | Murakami .......... G02F 1/13452 |

FOREIGN PATENT DOCUMENTS

| | | |
|---|---|---|
| TW | 201643893 A | 12/2016 |
| TW | 202036127 A | 10/2020 |
| TW | 202136454 A | 10/2021 |

* cited by examiner

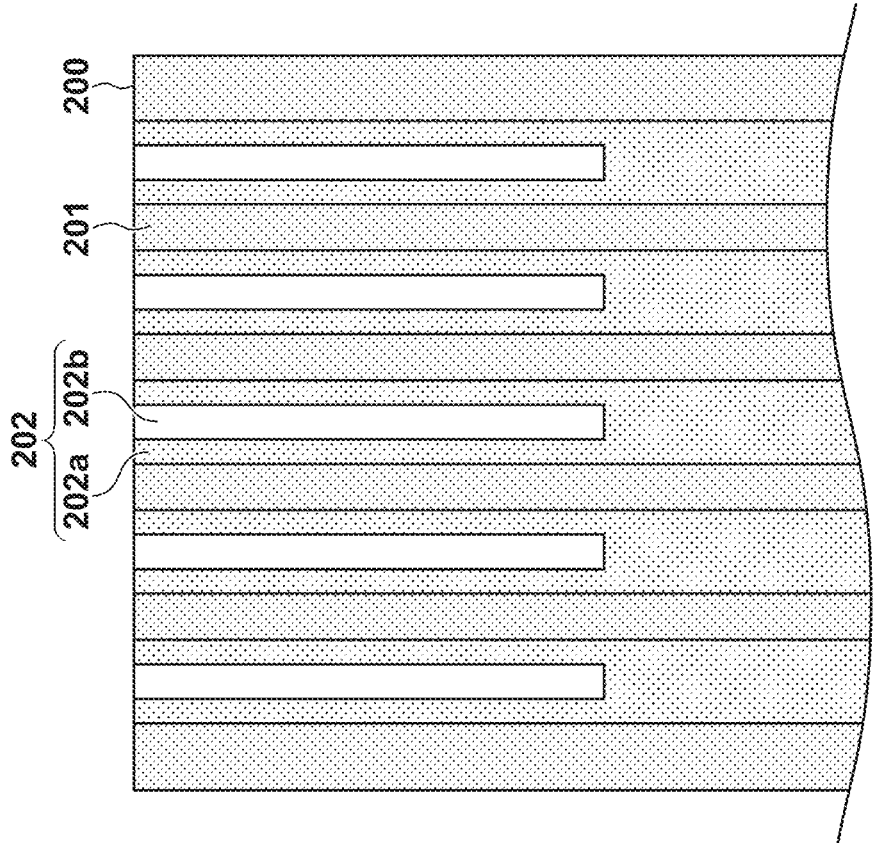
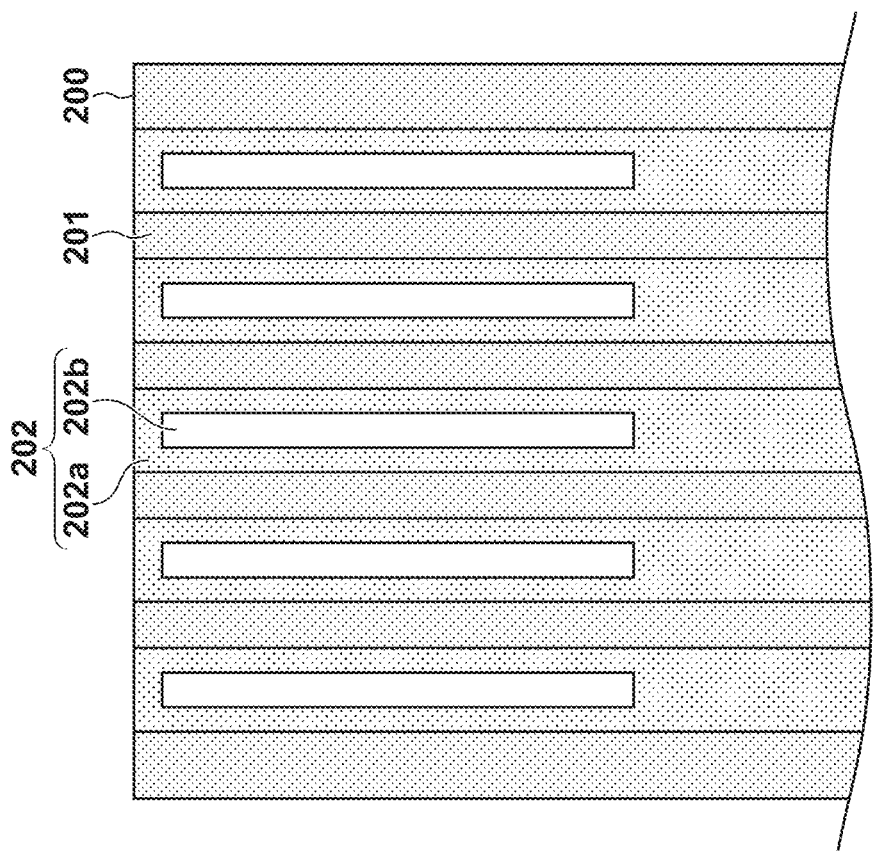

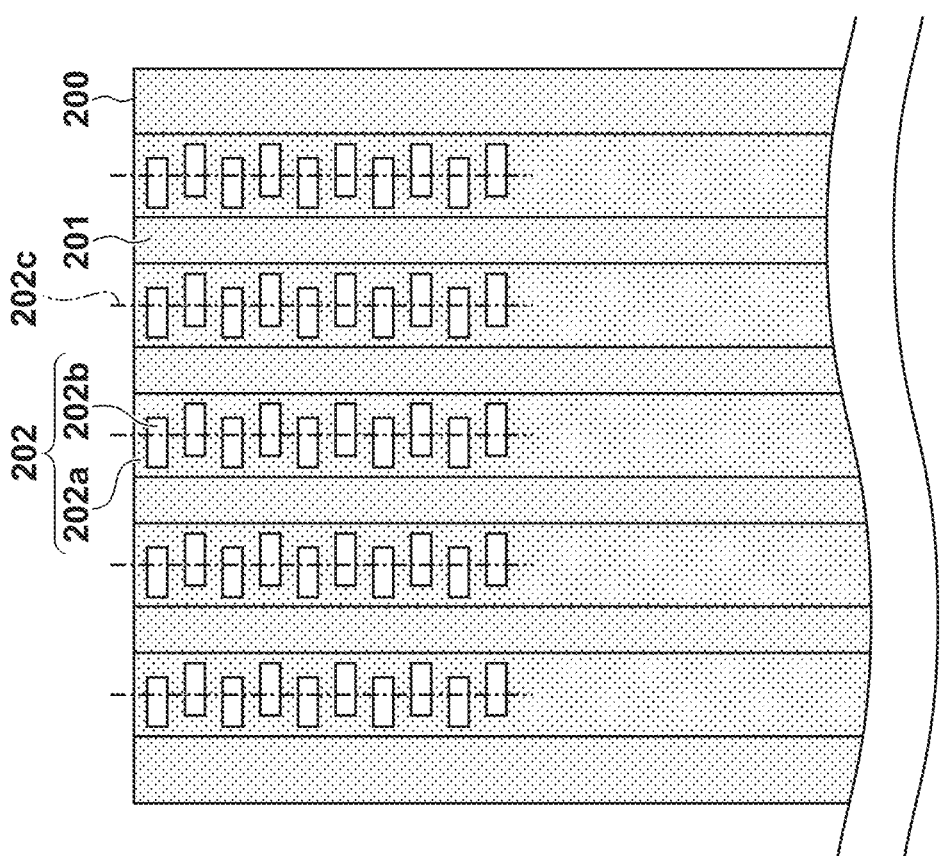
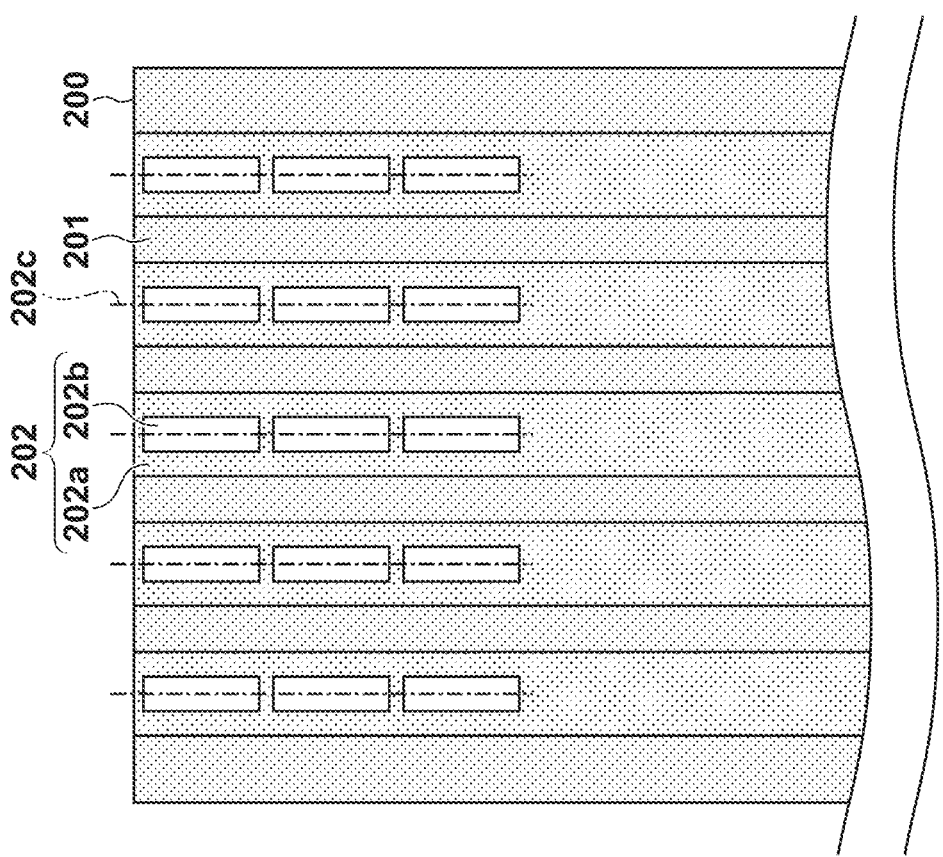

ELECTRONIC COMPONENT, MANUFACTURING METHOD THEREOF, AND ELECTRONIC APPARATUS

CROSS REFERENCE TO RELATED APPLICATIONS

This application is a divisional application of U.S. patent application Ser. No. 18/152,237, filed Jan. 10, 2023, which claims the benefit of Japanese Patent Application No. 2022-012027, filed Jan. 28, 2022. Both of these prior applications are hereby incorporated by reference herein in their entirety.

BACKGROUND OF THE INVENTION

Field of the Invention

The present invention relates to an electronic component, a manufacturing method thereof, and an electronic apparatus.

Description of the Related Art

An electronic component that can be incorporated in apparatuses such as an image capturing apparatus and a display apparatus can include an electronic board with an electronic device provided thereon, and a circuit board for externally supplying power to the electronic board. The electronic board can include a device region where the electronic device is arranged, and a peripheral region provided on the outer edge side of the device region. A connection terminal is provided in the peripheral region, and the circuit board such as a flexible printed board (FPC) can be electrically bonded to the connection terminal. As the bonding member, for example, an Anisotropic Conductive Film (ACF) containing conductive particles, an Anisotropic Conductive Paste (ACP), or the like can be used. There is known a thermocompression bonding method of pressurizing the bonding member as described above while heating it, thereby electrically connecting the connection terminal and the circuit board. As a method of electrically connecting electrodes arranged on a glass substrate and connection electrodes arrayed so as to correspond to the electrodes by using a thermosetting resin, Japanese Patent Laid-Open No. 2006-253665 discloses a method of curing the thermosetting resin by irradiation of laser light.

The method of irradiating the thermosetting resin with laser light is advantageous in efficiently curing the bonding member since the laser light is selectively applied to the bonding member and no excessive heat is given to constituent members other than the bonding member, for example, the electronic board. However, the bonding member includes a region covered with an opaque electrode and a region not covered with the electrode. The region not covered with the electrode is easily cured since it is directly irradiated with the laser light. On the other hand, the region covered with the opaque electrode is not easily cured since the laser light is blocked by the electrode. Therefore, the method of irradiating the bonding member with light such as laser light has a problem that the region of the bonding member covered with the opaque electrode cannot be cured stably.

SUMMARY OF THE INVENTION

The present invention provides a technique advantageous in effectively curing a bonding member.

A first aspect of the present invention provides a manufacturing method of an electronic component, the method comprising: preparing a first structure in which a first electrode is arranged on a first main surface of a first substrate; preparing a second structure in which a second electrode is arranged on a first main surface of a second substrate; and curing a bonding member while making the first main surface of the first substrate and the first main surface of the second substrate face each other via the bonding member and applying a force to the first structure and the second structure so as to pressurize the bonding member, wherein at least one of the first electrode and the second electrode includes a window portion, and in the curing, the bonding member is cured by irradiating the bonding member with light through the window portion.

A second aspect of the present invention provides an electronic component comprising: a first structure in which a first electrode is arranged on a first main surface of a first substrate, a second structure in which a second electrode is arranged on a first main surface of a second substrate, and a bonding member arranged between the first main surface of the first substrate and the first main surface of the second substrate so as to electrically bond the first electrode and the second electrode, wherein at least one of the first electrode and the second electrode includes a window portion that transmits light.

A third aspect of the present invention provides an electronic apparatus that comprises an electronic component defined in the second aspect of the present invention, wherein the electronic component is formed as a display panel.

Further aspects of the present invention will become apparent from the following description of exemplary embodiments with reference to the attached drawings.

BRIEF DESCRIPTION OF THE DRAWINGS

FIGS. 7A and 7B are views each showing an electronic component according to the fourth embodiment;

FIGS. 10A and 10B are views each showing an electronic component according to the seventh embodiment;

DESCRIPTION OF THE EMBODIMENTS

Figure 1:
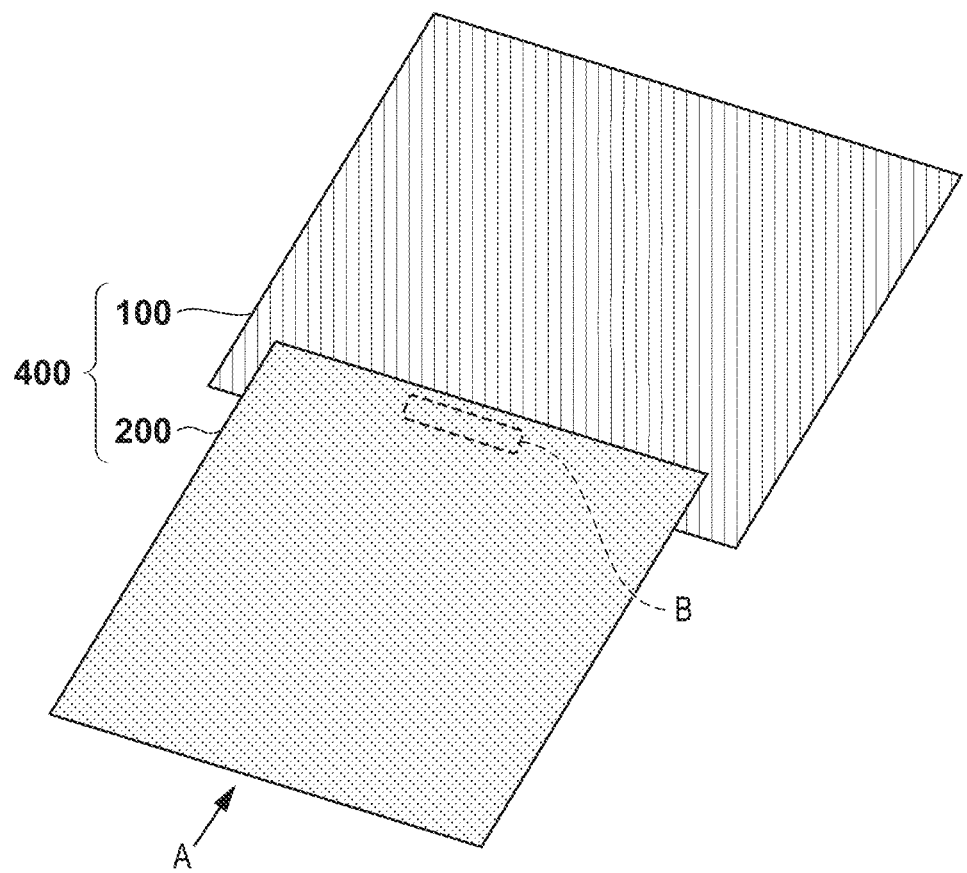
FIG. 1 is a perspective view showing an electronic component according to the first to eighth embodiments.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Figure 2:
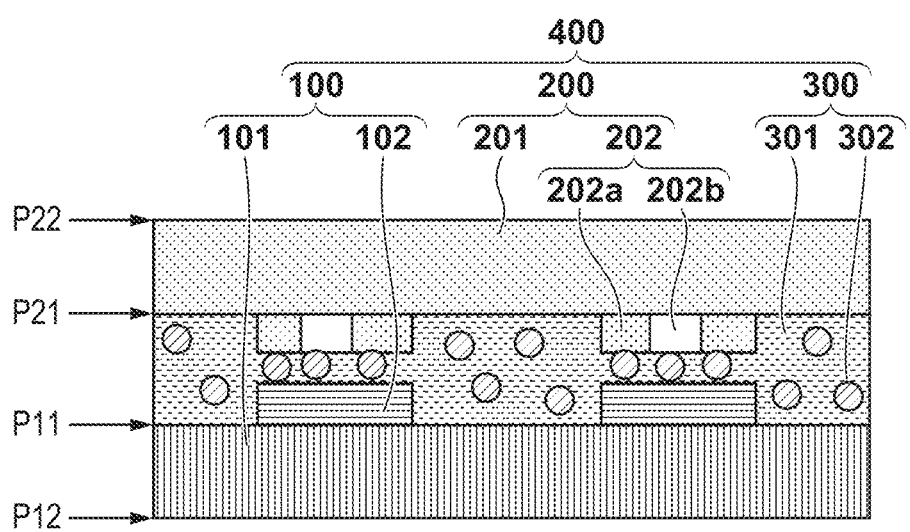
FIG. 2 is a sectional view of the electronic component according to the first embodiment (a portion B shown in FIG. 1)

An electronic component 400 according to the first embodiment will be described with reference to FIGS. 1 and 2. FIG. 1 is a perspective view showing the structure of the electronic component 400 according to the first embodiment, and FIG. 2 is a sectional view of a portion B when viewed from the direction of an arrow A in FIG. 1. The electronic component 400 can include a first structure (electronic board) 100, a second structure (circuit board) 200, and a bonding member 300.

The first structure 100 can include a first substrate 101 made of a substrate material such as silicon or glass, and a first electrode 102 arranged on a first main surface P11 of the first substrate 101. The first main surface P11 of the first substrate 101 can include a device region where an electronic device is arranged, and a peripheral region arranged between the device region and the edge of the first substrate 101. The first electrode 102 can be arranged in the peripheral region. The second structure 200 can include a second substrate 201, and a second electrode 202 arranged on a first main surface P21 of the second substrate 201. The second electrode 202 is arranged so as to face the first electrode 102. Typically, the first substrate 101 includes a plurality of the first electrodes 102 arranged on the first main surface P11, and the second substrate 201 includes a plurality of the second electrodes 202 arranged on the first main surface P21. In this case, each second electrode 202 of the plurality of the second electrodes 202 faces the corresponding one of the plurality of the first electrodes 102. The bonding member 300 is arranged between the first main surface P11 of the first substrate 101 and the first main surface P21 of the second substrate 201 so as to electrically bond the first electrode 102 of the first structure 100 and the second electrode 202 of the second structure 200.

The second structure 200 is, for example, a printed wiring board. More specifically, the second structure 200 can be a rigid substrate such as a glass epoxy substrate or a composite substrate with a wiring pattern printed thereon. Alternatively, the second structure 200 may be a flexible wiring board with a wiring pattern formed in a flexible film of polyimide or the like. Alternatively, the second structure 200 may be a rigid flexible wiring board obtained by combining a flexible film and a rigid substrate. The second structure 200 can be configured to supply power to the first substrate 101 of the first structure 100. The second structure 200 can also have a function of supplying a signal to the first substrate 101 of the first structure 100, and a function of transmitting or outputting a signal output from the first substrate 101 of the first structure 100 to another apparatus. The second electrode 202 can be provided with a window portion 202b. From another viewpoint, the second electrode 202 includes an electrode portion 202a and the window portion 202b. The window portion 202b may be an opening portion provided in the second electrode 202, or the window portion 202b may be formed by filling the opening portion with a transparent member. In the former case, the opening portion can be filled with air. The window portion may be provided in the first electrode 102 of the first structure 100, or the window portions may be provided in both the first electrode 102 of the first structure 100 and the second electrode 202 of the second structure 200, respectively.

The bonding member 300 can include a bonding resin 301 and a plurality of conductive particles 302 dispersedly arranged in the bonding resin 301. For example, the bonding resin 301 can be an adhesive such as a thermosetting resin, a UV-curable resin (photo-curable resin), or a UV-curable thermosetting resin.

Figure 3A:
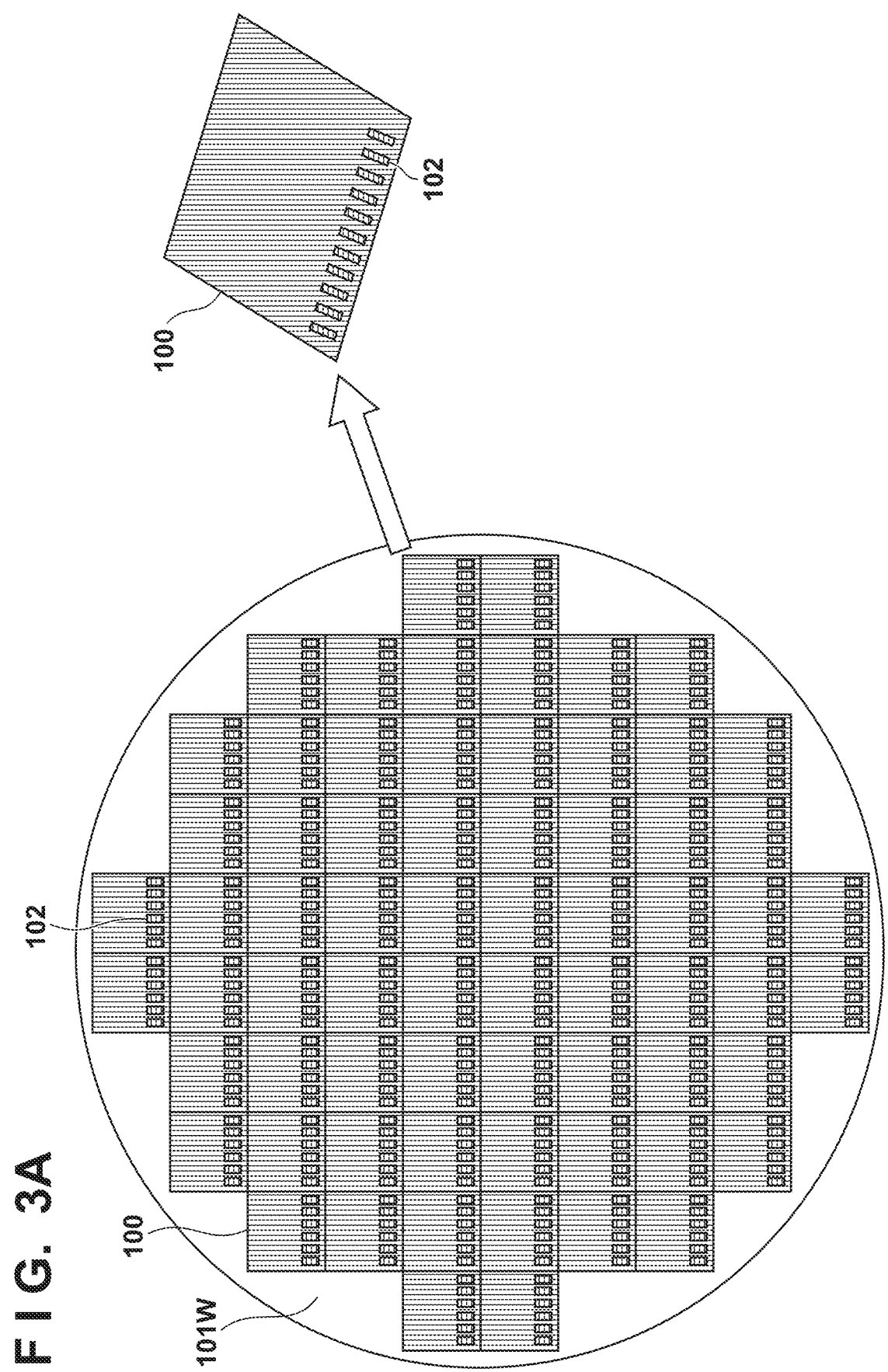
FIG. 3A is a view for explaining a manufacturing method of the electronic component according to the first embodiment.

A manufacturing method of the electronic component 400 according to the first embodiment will be described below with reference to FIGS. 3A to 3C and 4. First, as illustrated in FIG. 3A, a plurality of the first structures 100 are formed on the first main surface of a substrate 101W such as silicon or glass, and the plurality of the first structures 100 are divided by dicing or the like. Thus, the divided first structure 100 is prepared. Each first structure 100 includes an electronic device and the first electrodes 102. Although not particularly limited, the electronic device can be, for example, at least one of an image capturing device, a display device (for example, a liquid crystal display device or an organic EL display device), and a piezoelectric device.

Figure 3B:
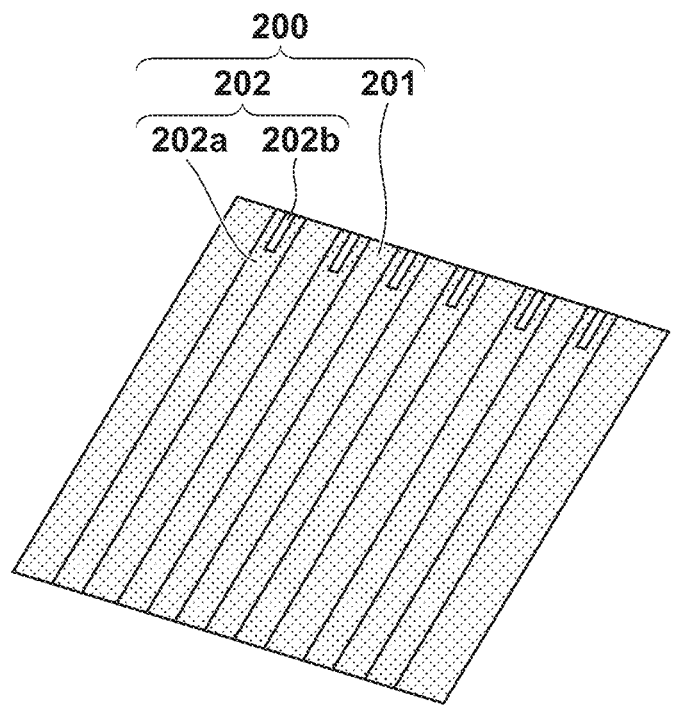
FIG. 3B is a view for explaining the manufacturing method of the electronic component according to the first embodiment.

Next, as illustrated in FIG. 3B, the second structure 200 is created by forming, on the first main surface of the second substrate 201, the second electrode 202 including the window portion 202b. From another viewpoint, the second structure 200 is created by forming, on the first main surface of the second substrate 201, the second electrode 202 including the electrode portion 202a and the window portion 202b. Thus, the second structure 200 is prepared.

Figure 3C:
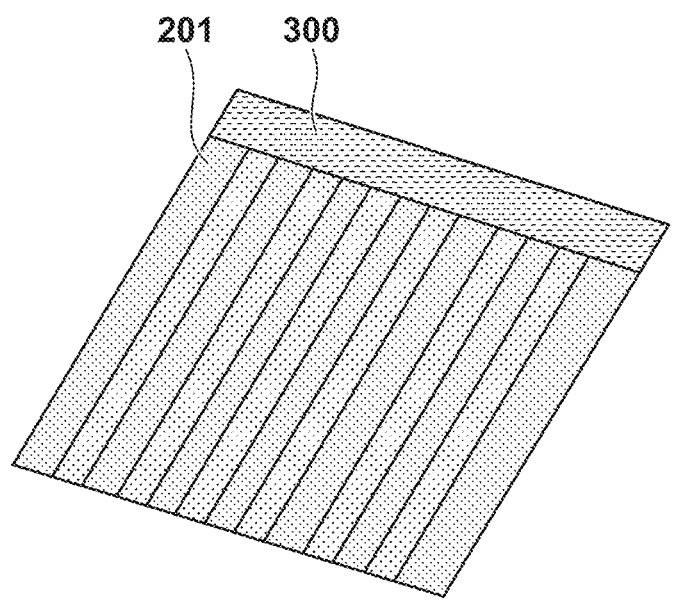
FIG. 3C is a view for explaining the manufacturing method of the electronic component according to the first embodiment.

Next, as illustrated in FIG. 3C, the bonding member 300 is arranged in a region where the first electrode 102 and the second electrode 202 are to be electrically connected to each other. The bonding member 300 can be, for example, a film-like ACF or a liquid ACP. Here, the bonding member 300 is arranged on the first main surface of the second substrate 201, but the bonding member 300 may be arranged on the first main surface of the first substrate 101. As has been described above, the bonding member 300 can include the bonding resin 301 and the plurality of conductive particles 302 dispersedly arranged in the bonding resin 301.

Figure 4:
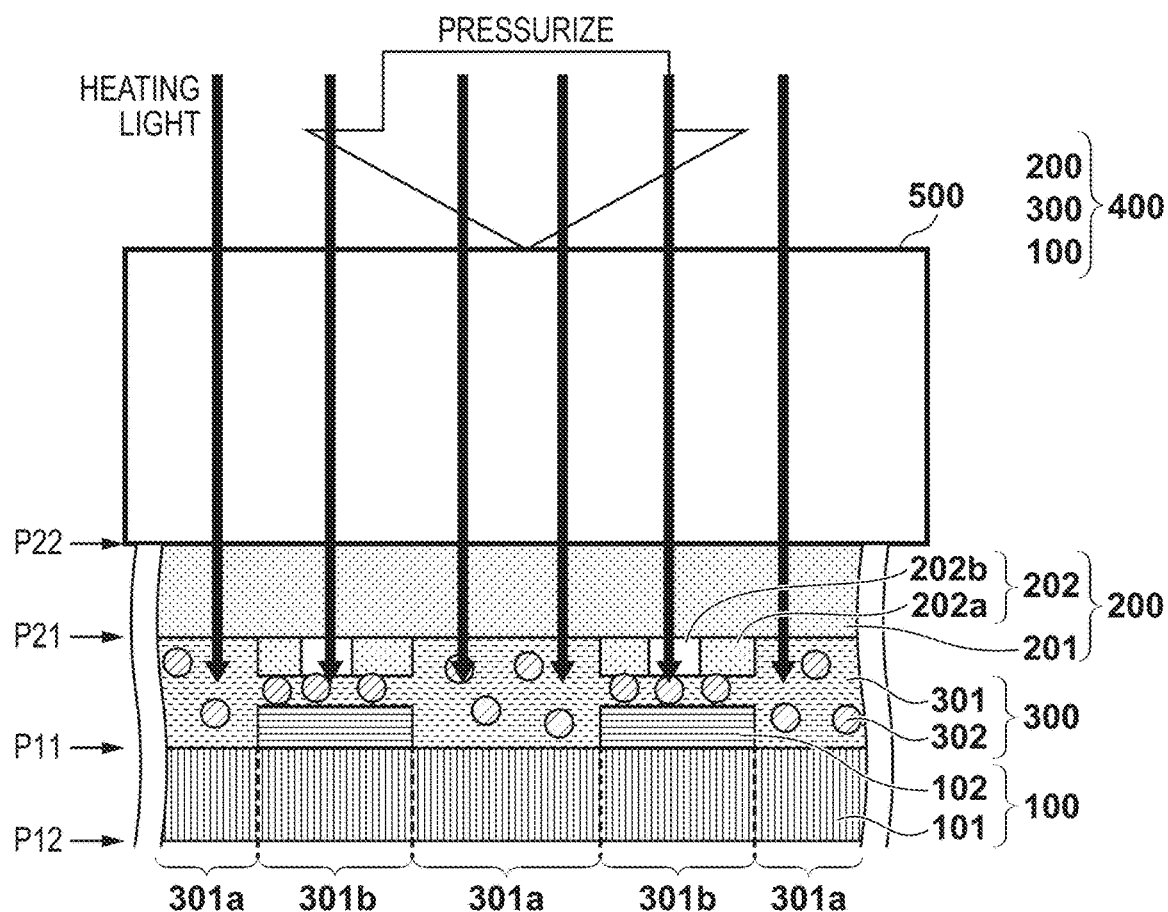
FIG. 4 is a view for explaining the manufacturing method of the electronic component according to the first embodiment.

Next, a curing step illustrated in FIG. 4 is performed. In the curing step, the first main surface P11 of the first substrate 101 and the first main surface P21 of the second substrate 201 are made face each other via the bonding member 300, and the bonding member 300 is cured while applying a force to the first structure 100 and the second structure 200 so as to pressurize the bonding member 300. In the curing step, a compression bonding head 500 can apply a pressure to the first structure 100 and the second structure 200 in a direction in which the first main surface P11 of the first substrate 101 and the first main surface P21 of the second substrate 201 come close to each other. Further, in the curing step, light (to be referred to as heating light hereinafter) such as laser light can be applied to the bonding member 300 via the compression bonding head 500 from a normal direction of a second surface P22 of the second substrate 201 of the second structure 200 including the window portion 202b. The compression bonding head 500 can be made of a material, for example, glass, that transmits the heating light. The heating light has a wavelength band that cures the bonding resin 301 of the bonding member 300, and the compression bonding head 500 is configured to transmit light of this wavelength band. The window portion 202b may be the opening portion filled with air or the like, or may be made of a material that transmits the heating light. The second substrate 201 is also made of a material that transmits the heating light. The absorption rate of the heating light by the bonding member 300 is higher than the absorption rate of the heating light by the second electrode 202 including the window portion 202b. Similarly, in a case in which the first electrode 102 includes a window portion, the absorption rate of the heating light by the bonding member 300 is higher than the absorption rate of the heating light by the first electrode 102 including the window portion.

The bonding member 300 includes a first portion arranged in a first region 301a not sandwiched between the first electrode 102 and the second electrode 202, and a second portion arranged in a second region 301b sandwiched between the first electrode 102 and the second electrode 202 (including the window portion 202b). The first portion of the bonding member 300 arranged in the first region 301a is irradiated with the heating light via the second substrate 201, and this increases the temperature of the first portion and cures the first portion. The second portion of the bonding member 300 arranged in the second region 301b is irradiated with the heating light via the second substrate 201 and the window portion 202b. This increases the temperature of the second portion and cures the second portion. Note that a portion of the second portion covered with the electrode portion 202a of the second electrode 202 can be heated by the scattered light of the heating light entering through the window portion 202b in addition to the heat generated by the heating light entering through the window portion 202b.

If the window portion is provided in the first electrode 102 of the first structure 100, the bonding member 300 is irradiated with the heating light via the first substrate 101 of the first structure 100. More specifically, the first portion of the bonding member 300 arranged in the first region 301a is irradiated with the heating light via the first substrate 101, and the second portion of the bonding member 300 arranged in the second region 301b is irradiated with the heating light via the first substrate 101 and the window portion.

According to the first embodiment, it is also possible to cure the second portion of the bonding member 300 arranged in the second region 301b sandwiched between the first electrode 102 and the second electrode 202 (including the window portion 202b) by irradiation of the heating light via the window portion. Accordingly, for example, even in a region where the second electrodes 202 (or the first electrodes 102) are densely arranged, the bonding member 300 can be cured stably. In other words, according to the first embodiment, it is possible to stably cure the bonding member 300 over the entire region regardless of the arrangement density of the second electrodes 202 (or the first electrodes 102).

Second Embodiment

Figure 5A:
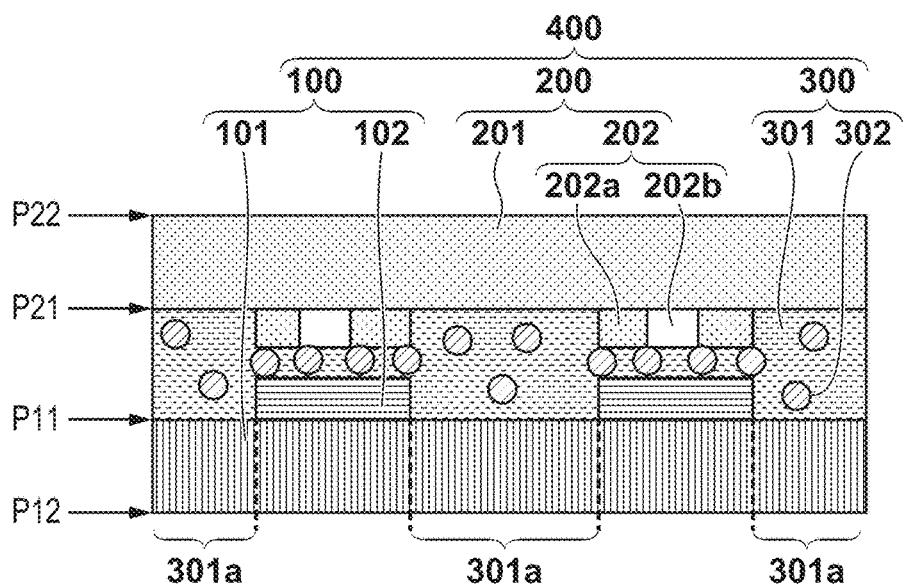
FIG. 5A is a sectional view of an electronic component according to the second embodiment (a portion B shown in FIG. 1)

An electronic component 400 according to the second embodiment will be described below with reference to FIGS. 1 and 5A to 5C. Matters not mentioned as the second embodiment can follow the first embodiment. FIG. 1 is a perspective view showing the structure of the electronic component 400 according to the second embodiment, and FIG. 5A is a sectional view of a portion B when viewed from a direction of an arrow A in FIG. 1.

In the electronic component 400 according to the second embodiment, the number of conductive particles 302 arranged between a first electrode 102 and a second electrode 202 is larger than that in the electronic component 400 according to the first embodiment illustrated in FIG. 2. The electronic component 400 according to the second embodiment is more suitable for high-speed communication than the electronic component 400 according to the first embodiment.

Figure 5B:
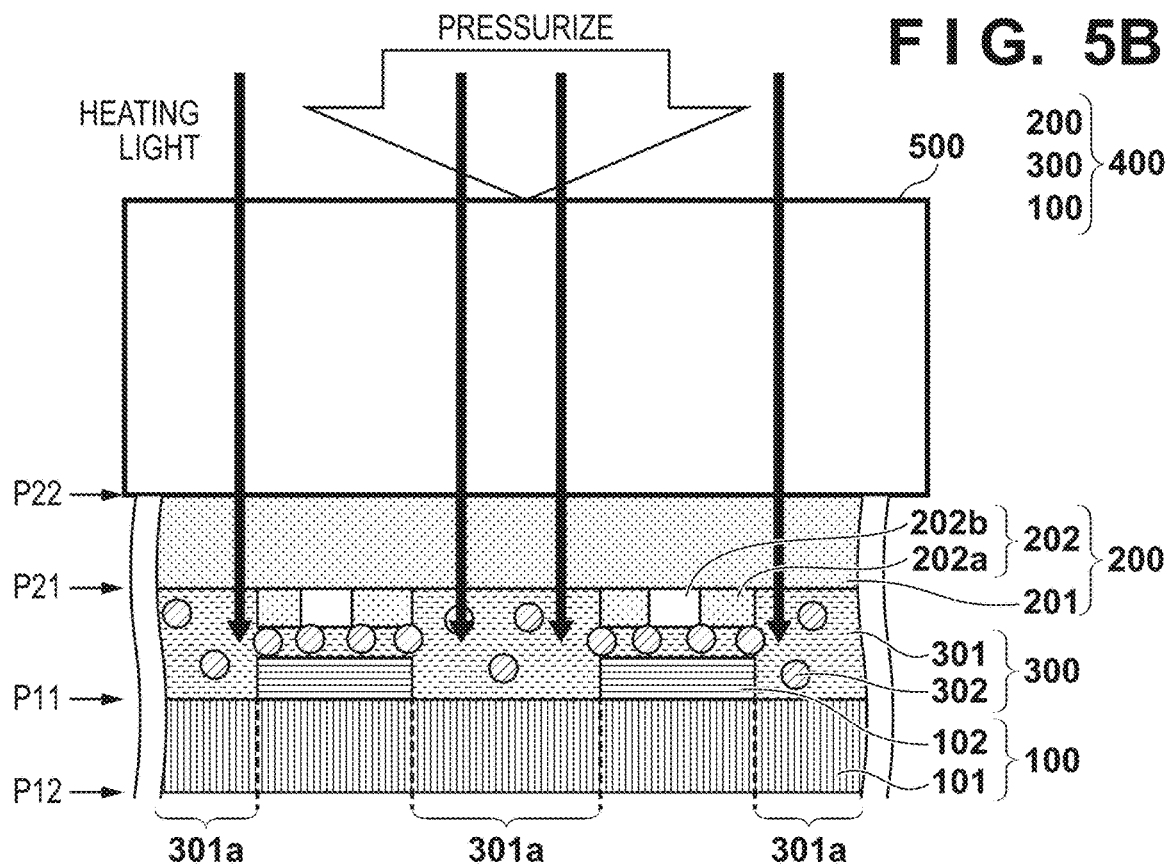
FIG. 5B is a view for explaining a manufacturing method of the electronic component according to the second embodiment.
Figure 5C:
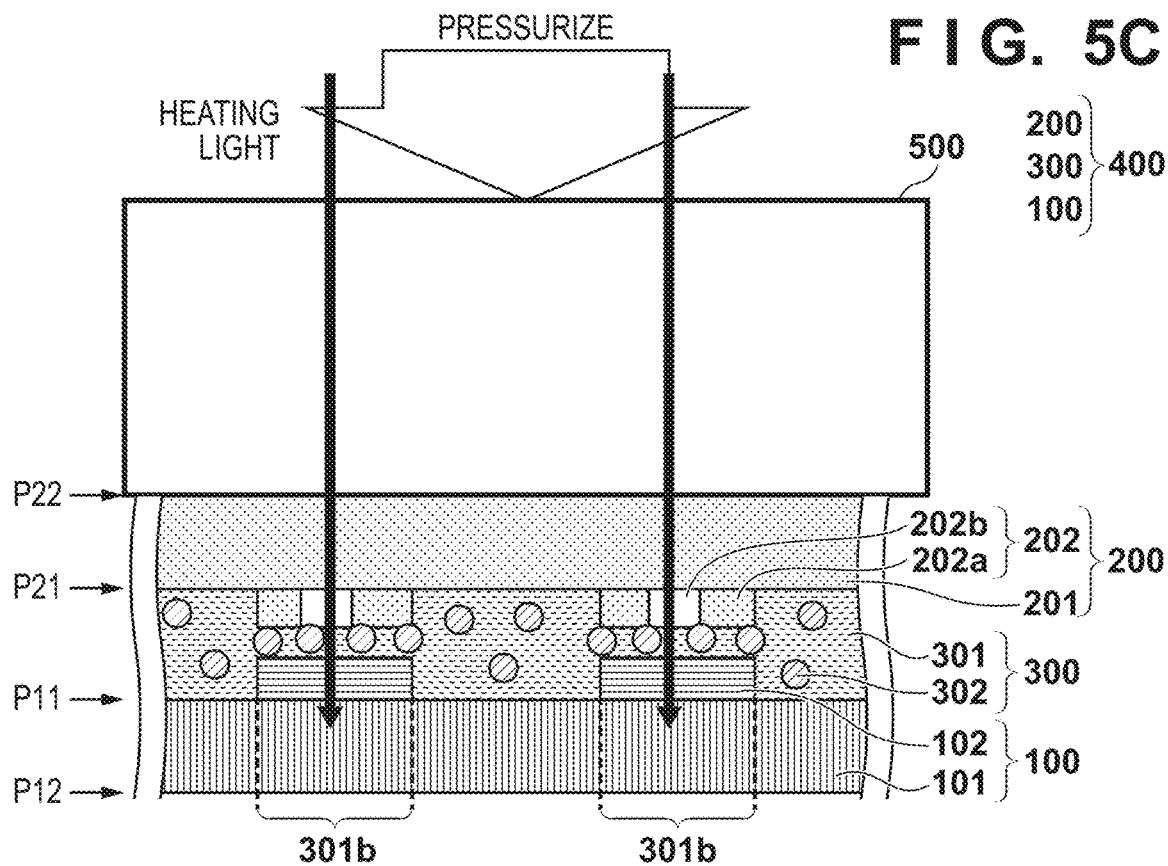
FIG. 5C is a view for explaining the manufacturing method of the electronic component according to the second embodiment.

A manufacturing method of the electronic component 400 according to the second embodiment will be described with reference to FIGS. 5B and 5C. In the first embodiment, the first region 301a and the second region 301b are simultaneously irradiated with the heating light. In the second embodiment, a first region 301a is irradiated with the heating light, and then a second region 301b is irradiated with the heating light.

Also in the second embodiment, a curing step is performed while making a first main surface P11 of a first substrate 101 and a first main surface P21 of a second substrate 201 face each other via a bonding member 300, and applying a force to a first structure 100 and a second structure 200 so as to pressurize the bonding member 300. The curing step in the second embodiment includes a first curing step and a second curing step performed after the first curing step. First, in the first curing step, as schematically shown in FIG. 5B, the heating light is selectively applied to a first portion of the bonding member 300 arranged in the first region 301a, and the first portion is cured after the fluidity of the first portion is increased. In the second curing step, as schematically shown in FIG. 5C, the heating light is selectively applied, via a window portion 202b, to a portion of a second portion where the window portion 202b exists, and the second portion is cured after the fluidity of the second portion is increased.

When the fluidity of the second portion arranged in the second region 301b sandwiched between the first electrode 102 and the second electrode 202 is increased, the conductive particles 302 in the second portion can move. In the first embodiment, the fluidities in the first portion and second portion are increased by simultaneously irradiating the first portion and the second portion with the heating light. With this, in the first embodiment, some of the conductive particles 302 in the second portion, which is receiving a higher pressure due to the existence of the first electrode 102 and second electrode 202, can move to the first portion. On the other hand, in the second embodiment, the first portion arranged in the first region 301a not sandwiched between the first electrode 102 and the second electrode 202 is cured prior to the second portion arranged in the second region 301b sandwiched between the first electrode 102 and the second electrode 202. Hence, according to the second embodiment, movement of the conductive particles 302 from the second portion to the first portion is suppressed. As a result, it is possible to increase the number of the conductive particles 302 in the second portion arranged in the second region 301b sandwiched between the first electrode 102 and the second electrode 202 as compared to that in first embodiment. Accordingly, the electric resistance value between the first electrode 102 and the second electrode 202 in the second embodiment can be smaller than in the first embodiment. Therefore, the electronic component 400 according to the second embodiment is more suitable for high-speed communication than the electronic component 400 according to the first embodiment.

Third Embodiment

Figure 6:
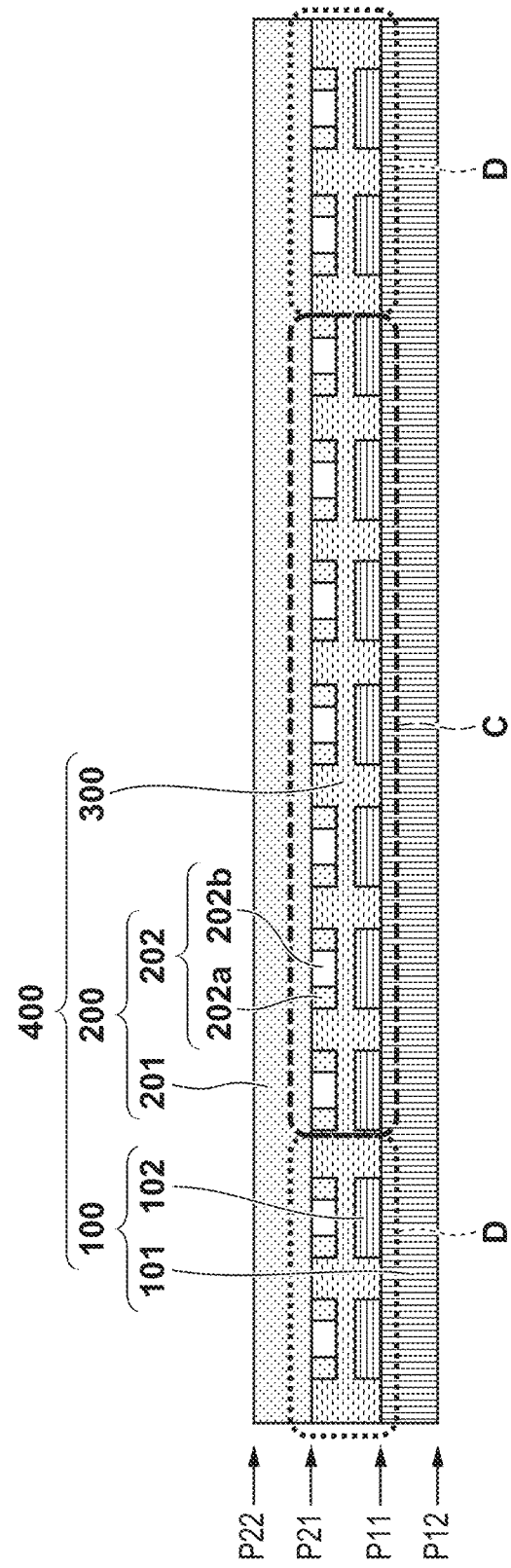
FIG. 6 is a view for explaining a manufacturing method of an electronic component according to the third embodiment.

An electronic component 400 according to the third embodiment will be described below with reference to FIGS. 1 and 6. Matters not mentioned as the third embodiment can follow the first embodiment. FIG. 1 is a perspective view showing the structure of the electronic component 400 according to the third embodiment, and FIG. 6 is a sectional view of a portion B when viewed from a direction of an arrow A in FIG. 1.

The manufacturing method of the electronic component 400 in the third embodiment is different from that in the first embodiment. Also in the third embodiment, a curing step is performed while making a first main surface P11 of a first substrate 101 and a first main surface P21 of a second substrate 201 face each other via a bonding member 300, and applying a force to a first structure 100 and a second structure 200 so as to pressurize the bonding member 300. The curing step in the third embodiment includes a first curing step and a second curing step performed after the first curing step. In the first curing step, the heating light is applied to a central portion C of the bonding member 300 in the electrode array direction (predetermined direction). In the second curing step performed next to the first curing step, the heating light is applied to peripheral portions D of the bonding member 300 in the electrode array direction. Here, the electrode array direction is the array direction of first electrodes 102, and this is also the array direction of second electrodes. In FIG. 6, the electrode array direction is the left-right direction. The "central portion" and the "peripheral portion" are relative terms. The outer side of the central portion is the peripheral portion, and the inner side of the peripheral portion is the central portion.

When the heating light is applied to the bonding member 300, the temperature of the bonding member 300 increases. For example, if the bonding member 300 is a bonding material including an organic material like an FPC, the bonding member 300 expands as the temperature increases. As a result, if the entire bonding member 300 is cured at once as in the manufacturing method according to the first embodiment, the alignment accuracy between the first electrode 102 and a second electrode 202 may be degraded in the peripheral portion D due to the expansion of the bonding member 300.

In the third embodiment, since the second curing step of curing the peripheral portion D is performed after the first curing step of curing the central portion C is performed, the expansion of the bonding member 300 is less likely to affect the second curing step. The third embodiment is advantageous when using a bonding member having a large linear expansion coefficient like the FPC, and when using a long electronic component susceptible to expansion of the bonding member.

Fourth Embodiment

An electronic component 400 according to the fourth embodiment will be described below with reference to FIGS. 7A and 7B. Matters not mentioned as the fourth embodiment can follow the first to third embodiments. The fourth embodiment provides an example of a window portion provided in a second electrode 202 and/or a first electrode 102. The window portion provided in the second electrode 202 is illustrated here, but a similar structure may be applied to the first electrode 102.

As illustrated in FIG. 7A, a second structure 200 can include a plurality of the second electrodes 202 (electrode portions 202a) on a first main surface of a second substrate 201, and one window portion 202b can be provided in one second electrode 202 (electrode portion 202a). The entire periphery of the window portion 202b may be surrounded by the electrode portion 202a as illustrated in FIG. 7A, or the window portion 202b may be partially surrounded by the electrode portion 202a as illustrated in FIG. 7B. The window portion 202b may have a rectangular shape as illustrated in FIGS. 7A and 7B. Alternatively, the window portion 202b may have a curved shape, a circular or oval shape, or another shape.

Fifth Embodiment

An electronic component 400 according to the fifth embodiment will be described below with reference to FIG. 8. Matters not mentioned as the fifth embodiment can follow the first to third embodiments. The fifth embodiment provides an example of a window portion provided in a second electrode 202 and/or a first electrode 102. The window portion provided in the second electrode 202 is illustrated here, but a similar structure may be applied to the first electrode 102.

Figure 8:
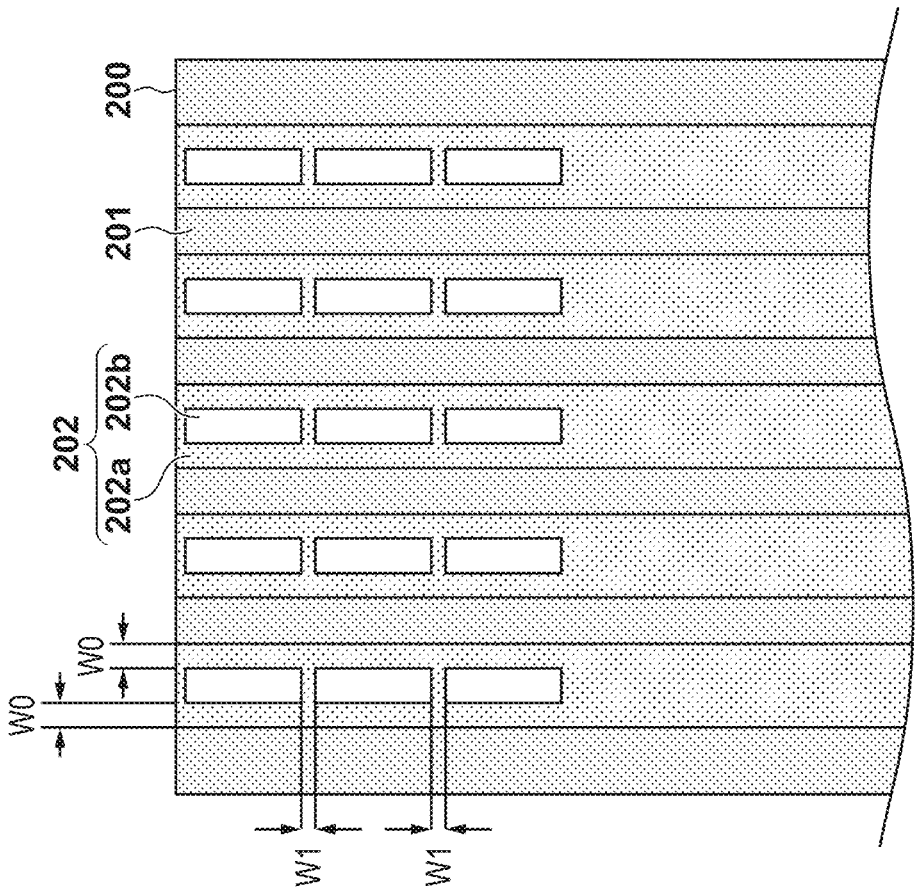
FIG. 8 is a view showing an electronic component according to the fifth embodiment.

As illustrated in FIG. 8, a second structure 200 can include a plurality of the second electrodes 202 (electrode portions 202a) on a first main surface of a second substrate 201, and a plurality of window portions 202b can be provided in one second electrode 202 (electrode portion 202a). The electrode portion 202a is arranged between the window portions 202b, and a bonding member including conductive particles is arranged between the electrode portion 202a of the second electrode 202 and the first electrode 102. Therefore, the electric resistance value between the first electrode 102 and the second electrode 202 can be decreased.

Sixth Embodiment

An electronic component 400 according to the sixth embodiment will be described below with reference to FIG. 9. Matters not mentioned as the sixth embodiment can follow the first to third embodiments. The sixth embodiment provides an arrangement example of a plurality of window portions provided in a second electrode 202 and/or a first electrode 102. The window portions provided in the second electrode 202 are illustrated here, but a similar structure may be applied to the first electrode 102.

Figure 9:
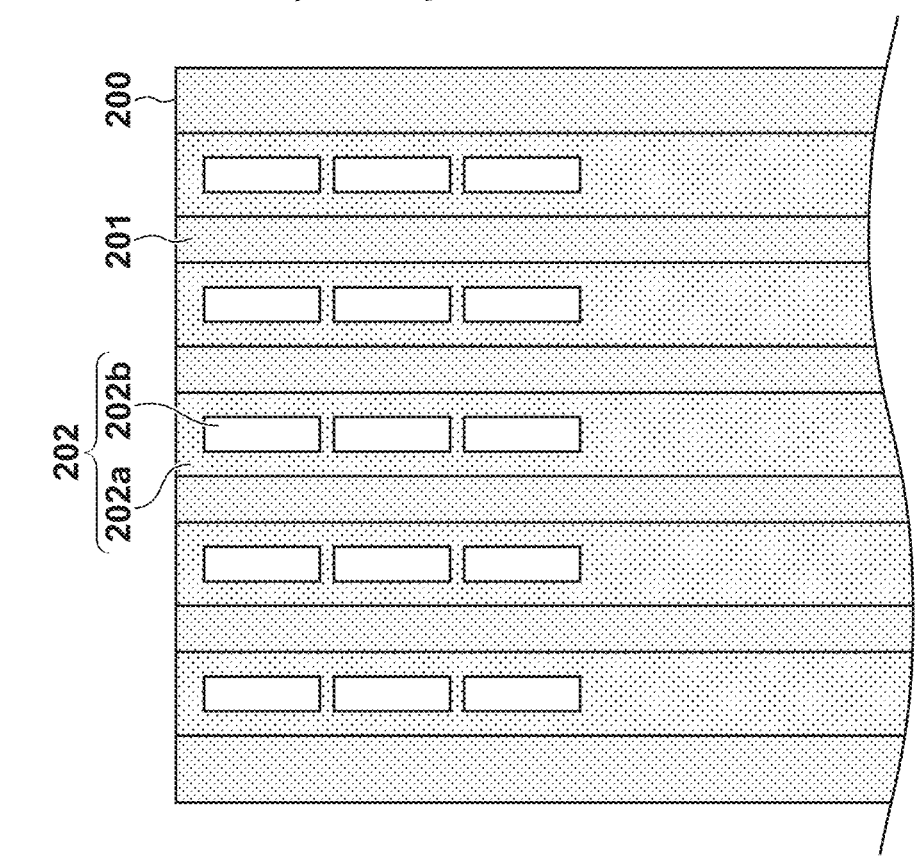
FIG. 9 is a view showing an electronic component according to the sixth embodiment.

As illustrated in FIG. 9, in each second electrode 202, a plurality of window portions 202b are arranged along the longitudinal direction of the second electrode 202. A distance W0 from the edge of each second electrode 202 in the lateral direction to each of the plurality of window portions 202b is larger than an interval W1 between the window portions 202b adjacent to each other out of the plurality of window portions 202b. The sixth embodiment is advantageous, for example, when it is desired to arrange more conductive particles in the region of the distance W0 from the edge of each second electrode 202 in the lateral direction to each of the plurality of window portions 202b than in the region of the interval W1 between the window portions 202b adjacent to each other.

Seventh Embodiment

An electronic component 400 according to the seventh embodiment will be described below with reference to FIGS. 10A and 10B. Matters not mentioned as the seventh embodiment can follow the first to third embodiments. The seventh embodiment provides an arrangement example of a plurality of window portions provided in a second electrode 202 and/or a first electrode 102. The window portions provided in the second electrode 202 are illustrated here, but a similar structure may be applied to the first electrode 102.

The seventh embodiment provides an example in which a center line 202c of each second electrode 202 (or first electrode 102) along the longitudinal direction passes through a plurality of window portions 202b. In an example shown in FIG. 10A, the plurality of window portions 202b are arranged in a straight line along the center line 202c. In the example shown in FIG. 10B, the plurality of window portions 202b are arranged zigzag along the center line 202c. Both examples are advantageous for controlling the temperature distribution formed in a bonding member 300 by heating light.

Eighth Embodiment

An electronic component 400 according to the eighth embodiment will be described below with reference to FIG. 11. Matters not mentioned as the eighth embodiment can follow the first to third embodiments. The eighth embodiment provides an arrangement example of a plurality of window portions provided in a second electrode 202 and/or a first electrode 102. The window portions provided in the second electrode 202 are illustrated here, but a similar structure may be applied to the first electrode 102.

Figure 11:
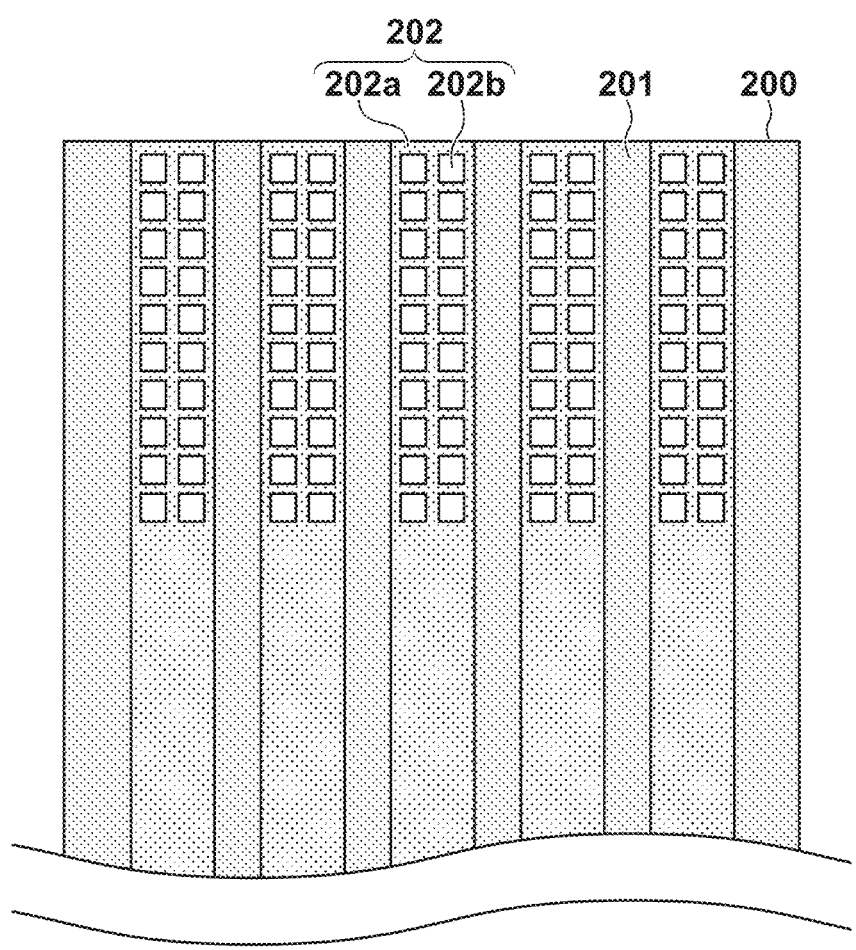
FIG. 11 is a view showing an electronic component according to the eighth embodiment.

The eighth embodiment provides an example in which the plurality of window portions are arranged in a grid in each second electrode 202 (or first electrode 102) as illustrated in FIG. 11. This arrangement is advantageous for controlling the temperature distribution formed in a bonding member 300 by heating light.

Ninth Embodiment

The bonding member in the first to eighth embodiments may be replaced with a photo-curable bonding member. In this case, light for curing the bonding member need not include a wavelength range that can heat the bonding member, but it is only required to include a wavelength range that can cure the bonding member by photopolymerization.

Application Examples

Figure 12:
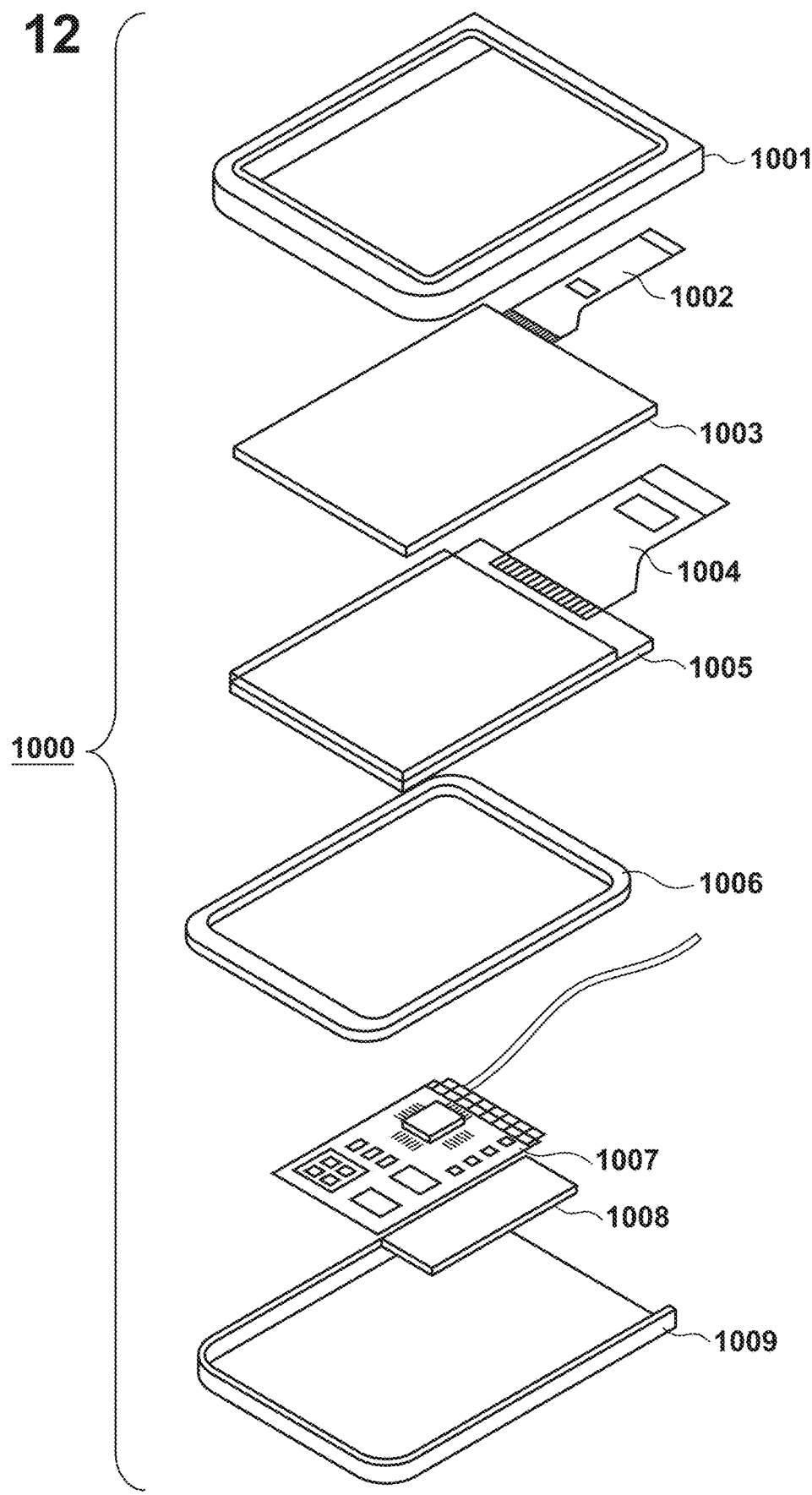
FIG. 12 is a schematic view showing an electronic apparatus or display apparatus according to an embodiment.

FIG. 12 is a schematic view showing an electronic apparatus or a display apparatus according to an embodiment. A display apparatus 1000 may include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Each of the touch panel 1003 and the display panel 1005 corresponds to the first substrate provided with the first electrode on its first main surface, and each of the flexible printed circuits (FPCs) 1002 and 1004 corresponds to the second substrate provided with the second electrode on its first main surface. Transistors are printed on the circuit board 1007. The battery 1008 is unnecessary if the display apparatus is not a portable apparatus. Even when the display apparatus is a portable apparatus, the battery 1008 may be arranged at another position.

The electronic apparatus or display apparatus according to this embodiment may include color filters of red, green, and blue. The color filters of red, green, and blue may be arranged in a delta array.

The display apparatus according to this embodiment may also be used for a display unit of a portable terminal. At this time, the display unit may have both a display function and an operation function. Examples of the portable terminal are a portable phone such as a smartphone, a tablet, and a head mounted display.

The electronic apparatus or display apparatus according to this embodiment may be used for a display unit of an image capturing apparatus including an optical unit including a plurality of lenses, and an image capturing device for receiving light having passed through the optical unit. The image capturing apparatus may include a display unit for displaying information acquired by the image capturing device. In addition, the display unit may be either a display unit exposed outside the image capturing apparatus, or a display unit arranged in the finder. The image capturing apparatus may be a digital camera or a digital video camera.

Figure 13A:
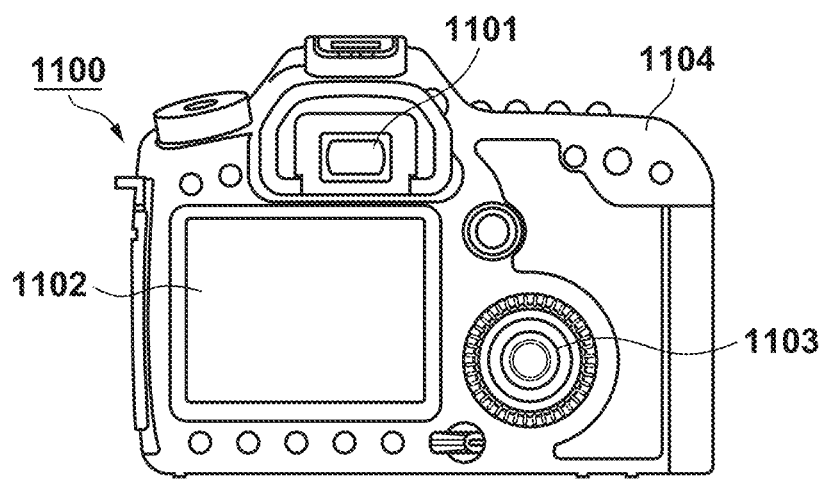
FIGS. 13A and 13B are schematic views each showing an electronic apparatus or display apparatus according to an embodiment.

FIG. 13A is a schematic view showing an electronic apparatus or image capturing apparatus according to an embodiment. An electronic apparatus or image capturing apparatus 1100 may include a viewfinder 1101, a rear display 1102, an operation unit 1103, and a housing 1104. The viewfinder 1101 may include the above-described electronic component. The electronic component may be, for example, a display apparatus. The display apparatus may display not only an image to be captured but also environment information, image capturing instructions, and the like. Examples of the environment information may be the intensity and direction of external light, the moving velocity of an object, and the possibility that an object is covered with an obstacle.

The electronic apparatus or image capturing apparatus 1100 includes an optical unit (not shown). This optical unit includes a plurality of lenses, and forms an image on an image capturing device that is accommodated in the housing 1104. The focal points of the plurality of lenses can be adjusted by adjusting the relative positions. This operation can also automatically be performed. The image capturing apparatus may be understood as a photoelectric conversion apparatus. Instead of sequentially capturing an image, the photoelectric conversion apparatus can include, as an image capturing method, a method of detecting the difference from a previous image, a method of extracting an image from an always recorded image, or the like.

Figure 13B:
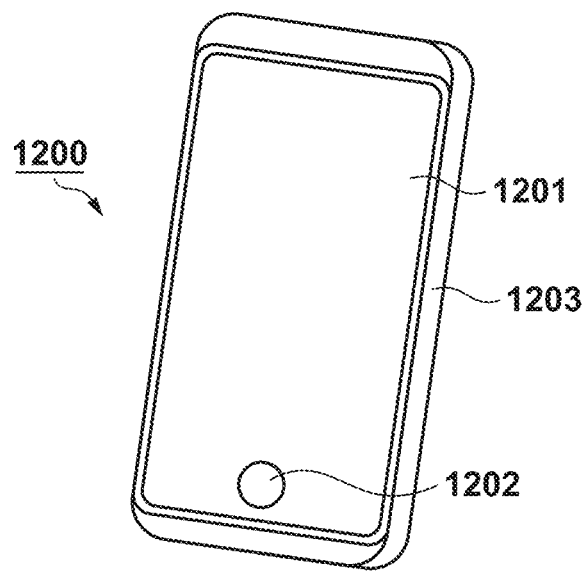

FIG. 13B is a schematic view showing an example of an electronic apparatus according to an embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 may be a button or a touch-panel-type reaction unit. The operation unit may also be a biometric authentication unit that performs unlocking or the like by authenticating the fingerprint. The electronic apparatus including the communication unit can also be regarded as a communication apparatus. The electronic apparatus can further have a camera function by including a lens and an image capturing device. An image captured by the camera function is displayed on the display unit. Examples of the electronic apparatus are a smartphone and a notebook computer.

Figure 14A:
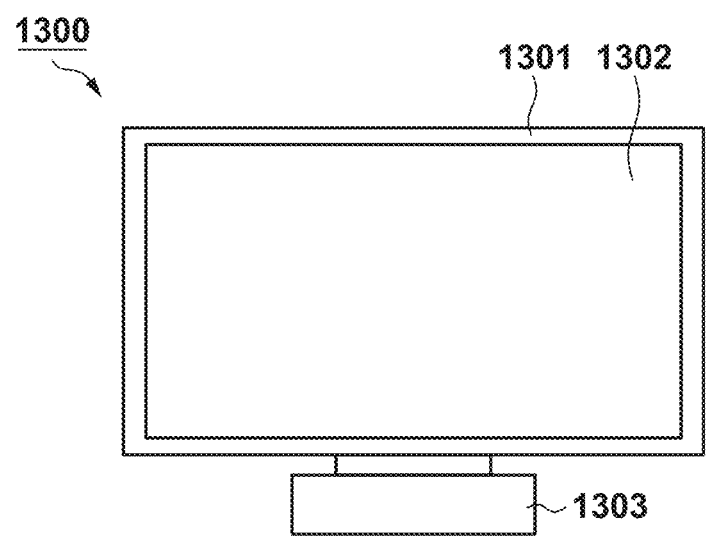
FIGS. 14A and 14B are views each showing an electronic apparatus formed as a display apparatus.

FIG. 14A shows an electronic apparatus formed as a display apparatus such as a television monitor or a PC monitor. A display apparatus 1300 includes a frame 1301 and a display unit 1302. The light emitting apparatus according to this embodiment can be used for the display unit 1302. The display apparatus 1300 includes a base 1303 that supports the frame 1301 and the display unit 1302. The base 1303 is not limited to the form shown in FIG. 14A. The lower side of the frame 1301 may also function as the base. In addition, the frame 1301 and the display unit 1302 may be bent. The radius of curvature in this case may be 5,000 (inclusive) mm to 6,000 (inclusive) mm.

Figure 14B:
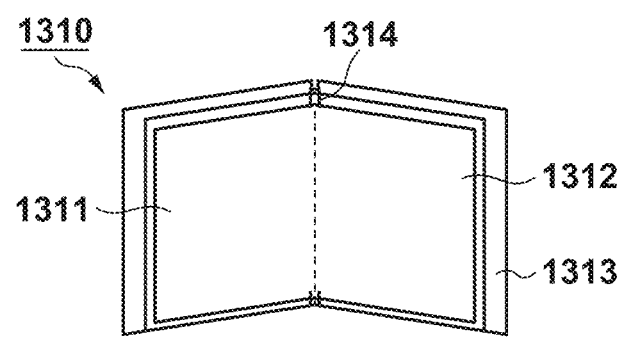

FIG. 14B is a schematic view showing an electronic apparatus or display apparatus according to an embodiment. An electronic apparatus or display apparatus 1310 shown in FIG. 14B is formed to be foldable, and formed as a so-called foldable display apparatus. The electronic apparatus or display apparatus 1310 includes a first display unit 1311, a second display unit 1312, a housing 1313, and a bending point 1314. Each of the first display unit 1311 and the second display unit 1312 may include the light emitting apparatus according to this embodiment. The first display unit 1311 and the second display unit 1312 may be one seamless display apparatus. The first display unit 1311 and the second display unit 1312 can be divided by the bending point. The first display unit 1311 and the second display unit 1312 may display different images, and may also display one image together.

The electronic apparatus or display apparatus can be applied to a system that can be worn as a wearable device such as smartglasses, an HMD, or a smart contact lens. The electronic apparatus may include an image capturing apparatus capable of photoelectrically converting visible light and a display apparatus capable of emitting visible light.

Figure 15A:
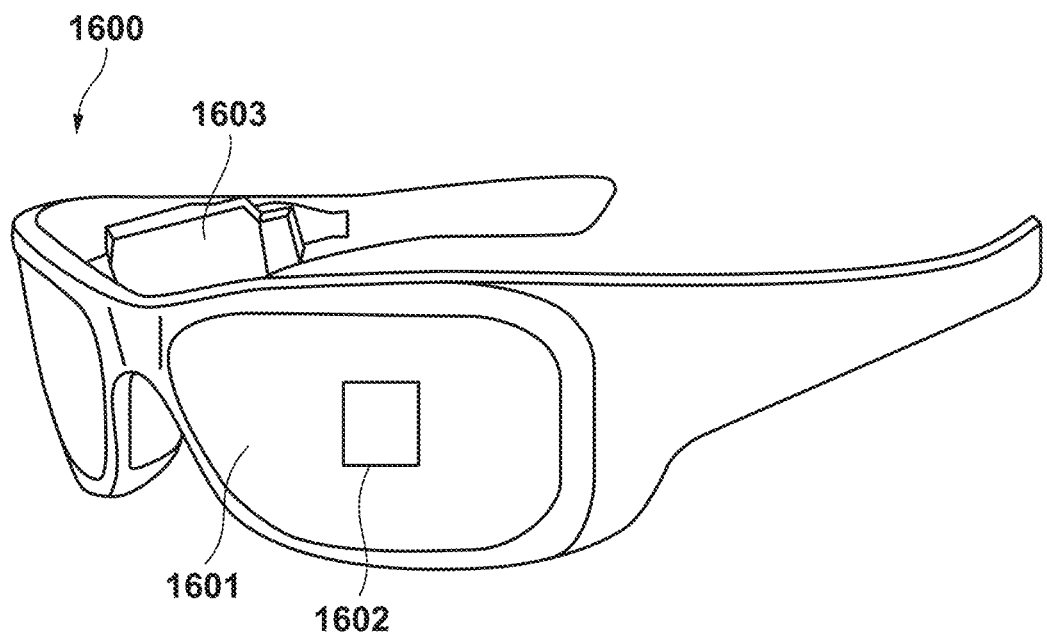
FIGS. 15A and 15B are views each showing an application example of an electronic apparatus.

Glasses 1600 (smartglasses) according to one application example of the electronic apparatus will be described with reference to FIG. 15A. An image capturing apparatus 1602 such as a CMOS sensor or an SPAD is provided on the surface side of a lens 1601 of the glasses 1600. In addition, the display apparatus as the electronic apparatus described above is provided on the back surface side of the lens 1601.

The glasses 1600 further include a control apparatus 1603. The control apparatus 1603 functions as a power supply that supplies power to the image capturing apparatus 1602 and the display apparatus according to each embodiment. In addition, the control apparatus 1603 controls the operations of the image capturing apparatus 1602 and the display apparatus. An optical system configured to condense light to the image capturing apparatus 1602 is formed on the lens 1601.

Figure 15B:
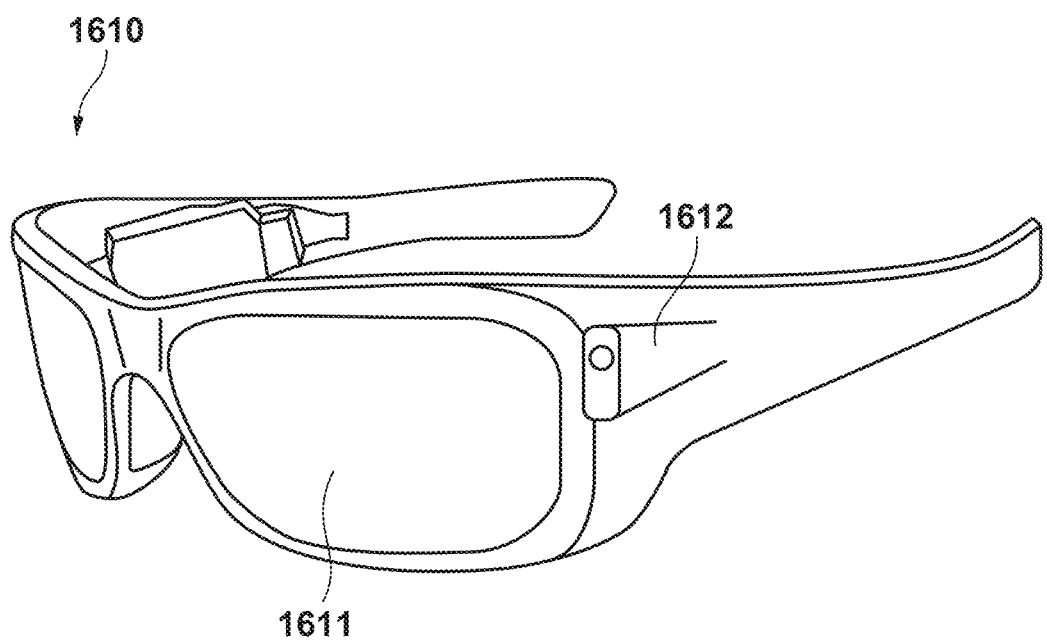

Glasses 1610 (smartglasses) according to one application example of the electronic apparatus will be described with reference to FIG. 15B. The glasses 1610 include a control apparatus 1612, and an image capturing apparatus corresponding to the image capturing apparatus 1602 and a display apparatus are mounted on the control apparatus 1612. The image capturing apparatus in the control apparatus 1612 and an optical system configured to project light emitted from the display apparatus are formed in a lens 1611, and an image is projected to the lens 1611. The control apparatus 1612 functions as a power supply that supplies power to the image capturing apparatus and the display apparatus, and controls the operations of the image capturing apparatus and the display apparatus. The control apparatus may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving device detects reflected light of the emitted infrared rays from the eyeball, thereby obtaining a captured image of the eyeball. Image quality degradation is reduced by providing a reduction means that reduces the light from the infrared ray emitting unit to the display unit in a planar view.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The display apparatus according to an embodiment of the present invention may include an image capturing apparatus including a light receiving device, and a displayed image on the display apparatus may be controlled based on the line-of-sight information of the user from the image capturing apparatus.

More specifically, in the display apparatus, a first field-of-view region which is gazed by the user and a second field-of-view region other than the first field-of-view region are determined based on the line-of-sight information. The first field-of-view region and the second field-of-view region may be determined by a control apparatus of the display apparatus. Alternatively, the first field-of-view region and the second field-of-view region may be determined by an external control apparatus and the display apparatus may receive information corresponding to this determination. Control can be performed in the display region of the display apparatus so that the display resolution of the first field-of-view region will be higher than the display resolution of the second field-of-view region. That is, the resolution of the second field-of-view region may be lowered more than the resolution of the first field-of-view region.

In addition, the display region includes a first display region and a second display region different from the first display region, and a region with a high degree of priority is determined from the first display region and the second display region of the display region based on the line-of-sight information. The first field-of-view region and the second field-of-view region may be determined by the control apparatus of the display apparatus. Alternatively, the first field-of-view region and the second field-of-view region may be determined by an external control apparatus and the display apparatus may receive information corresponding to this determination. Control may be performed so that the resolution of a region with the high degree of priority will be set higher than the resolution of a region other than the region with the high degree of priority. That is, the resolution of a region with a relatively low degree of priority may be set low.

Note that an AI may be used for the determination of the first field-of-view region and the region with the high degree of priority. The AI may be a model configured to estimate, from an image of the eyeball, the angle of the line of sight and the distance to an object as the target of the gaze by using the image of the eyeball and the direction actually gazed by the eyeball of the image as the teaching data. The display apparatus, the image capturing apparatus, or an external apparatus may include the AI program. If the AI program is included in an external apparatus, information determined by the AI program will be transmitted to the display apparatus by communication.

When performing display control based on line-of-sight detection, smartglasses further including an image capturing apparatus configured to capture the outside can preferably be applied. The smartglasses can display captured outside information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A manufacturing method of an electronic component, the method comprising:
    preparing a first structure in which a first electrode is arranged on a first main surface of a first substrate;
    preparing a second structure in which a second electrode is arranged on a first main surface of a second substrate; and
    curing a bonding member while making the first main surface of the first substrate and the first main surface of the second substrate face each other via the bonding member and applying a force to the first structure and the second structure so as to pressurize the bonding member,
    wherein at least one of the first electrode and the second electrode includes a window portion, and in the curing, the bonding member is cured by irradiating the bonding member with light through the window portion,
    wherein the bonding member includes:
    a first portion arranged in a first region not sandwiched between the first electrode and the second electrode; and
    a second portion arranged in a second region sandwiched between the first electrode and the second electrode, and
    wherein the curing includes:
    curing the first portion after a fluidity of the first portion is increased by selectively irradiating the first portion with the light; and
    curing the second portion after a fluidity of the second portion is increased by selectively irradiating, with the light through the window portion, a portion of the second portion where the window portion exists, after the curing of the first portion.

2. The method according to claim 1, wherein the window portion is an opening portion.

3. The method according to claim 1, wherein an absorption rate of the light by the bonding member is higher than an absorption rate of the light by one of the first electrode and the second electrode which includes the window portion.

4. The method according to claim 1, wherein the first structure includes a plurality of the first electrodes, and the plurality of the first electrodes are arranged along a predetermined direction,
    wherein the second structure includes a plurality of the second electrodes, and the plurality of the second electrodes are arranged along the predetermined direction, and
    wherein the curing of the bonding member includes:
    irradiating, with the light, a central portion of the bonding member in the predetermined direction; and
    irradiating, with the light, a peripheral portion of the bonding member in the predetermined direction after the irradiating of the central portion.

* * * * *